United States Patent
Wu et al.

(10) Patent No.: US 9,960,102 B2
(45) Date of Patent: May 1, 2018

(54) SEMICONDUCTOR DEVICES AND METHODS OF MANUFACTURING THE SAME

(71) Applicant: Advanced Semiconductor Engineering, Inc., Kaohsiung (TW)

(72) Inventors: Chung-Hsi Wu, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

(21) Appl. No.: 15/181,072

(22) Filed: Jun. 13, 2016

(65) Prior Publication Data
US 2017/0358518 A1 Dec. 14, 2017

(51) Int. Cl.
*H01L 23/48* (2006.01)
*H01L 21/78* (2006.01)
*H01L 23/00* (2006.01)

(52) U.S. Cl.
CPC ............ *H01L 23/481* (2013.01); *H01L 21/78* (2013.01); *H01L 24/09* (2013.01); *H01L 24/17* (2013.01); *H01L 24/81* (2013.01); *H01L 2224/02371* (2013.01)

(58) Field of Classification Search
CPC ....... H01L 2924/00014; H01L 2924/00; H01L 2224/32225; H01L 2924/00012; H01L 2225/06513
USPC .......... 257/637–640, 668, E21.577–E21.578, 257/E21.585–E21.588, 737, E23.011, 257/774, 738, E21.499, E23.069, 777, 257/E23.021, E23.067; 438/107, 109; 10/637–640, 668, E21.577–E21.578, 10/E21.585–E21.588
See application file for complete search history.

(56) References Cited

U.S. PATENT DOCUMENTS

| | | | |
|---|---|---|---|
| 7,969,004 B2 | 6/2011 | Ohnishi | |
| 8,581,402 B2 | 11/2013 | Yu et al. | |
| 2011/0285005 A1* | 11/2011 | Lin | ...................... H01L 21/4846 257/686 |
| 2012/0077314 A1* | 3/2012 | Park | ..................... H01L 25/0657 438/109 |
| 2012/0199981 A1* | 8/2012 | Jeong | .................... H01L 23/481 257/774 |
| 2013/0015504 A1 | 1/2013 | Kuo et al. | |
| 2015/0137341 A1* | 5/2015 | Liu | ..................... H01L 23/5386 257/692 |
| 2015/0162308 A1* | 6/2015 | Kraft | ................. H01L 23/49838 257/676 |

* cited by examiner

*Primary Examiner* — Jonathan Han
(74) *Attorney, Agent, or Firm* — Foley & Lardner LLP; Cliff Z. Liu (57) ABSTRACT

A semiconductor package includes a first semiconductor component, a second semiconductor component, and a connecting element. The first semiconductor component includes a first substrate, and a first bonding pad disposed adjacent to a first surface of the first substrate, and at least one conductive via structure extending from a second surface of the first substrate to the first bonding pad. The second semiconductor component includes a second substrate, a redistribution layer disposed adjacent to a first surface of the second substrate, and a second bonding pad disposed on the redistribution layer. The connecting element is disposed between the first bonding pad and the second bonding pad.

20 Claims, 10 Drawing Sheets

SEMICONDUCTOR DEVICES AND METHODS OF MANUFACTURING THE SAME

BACKGROUND

1. Technical Field

The present disclosure relates to a semiconductor package and method of manufacturing the same, and, more particularly, to a semiconductor package including at least two semiconductor components and method of manufacturing the same.

2. Description of the Related Art

There is a continuing desire to incorporate more than one semiconductor component into a single semiconductor package to reduce dimensions of the package. A semiconductor package incorporating multiple semiconductor components may be referred to as a system in package (SiP). Because semiconductor components may have different sizes and different coefficients of thermal expansion (CTE), warpage or cracking may occur in a semiconductor package incorporating multiple semiconductor components.

SUMMARY

In an embodiment, a semiconductor package includes a first semiconductor component, a second semiconductor component, and a connecting element. The first semiconductor component includes a first substrate, and a first bonding pad disposed adjacent to a first surface of the first substrate, and at least one conductive via structure extending from a second surface of the first substrate to the first bonding pad. The second semiconductor component includes a second substrate, a redistribution layer disposed adjacent to a first surface of the second substrate, and a second bonding pad disposed on the redistribution layer. The connecting element is disposed between the first bonding pad and the second bonding pad.

In an embodiment, a semiconductor package includes a wafer and multiple semiconductor components disposed adjacent to a first surface of the wafer. Each semiconductor component includes a substrate having a first surface and a second surface opposite to the first surface. Each semiconductor component further includes at least one bonding pad disposed adjacent to the first surface of the substrate and at least one conductive via structure extending from the second surface of the substrate to the bonding pad. Each semiconductor component is electrically connected to the first surface of the wafer through the bonding pad.

In an embodiment, a method of manufacturing includes (a) providing a first semiconductor component comprising a first substrate having a first surface and a second surface opposite to the first surface, the first semiconductor component further comprising at least one first bonding pad disposed adjacent to the first surface of the substrate; (b) providing a second semiconductor component comprising a second substrate and at least one second bonding pad disposed adjacent to a surface of the second substrate; (c) electrically connecting the first semiconductor component to the second semiconductor component through the first bonding pad and the second bonding pad; (d) disposing a protection layer on at least a portion of the second surface of the first substrate; and (e) forming at least one conductive via structure extending from a surface of the protection layer to the first bonding pad.

DETAILED DESCRIPTION

Spatial descriptions, such as "above," "below," "top," "bottom," "side," "over," "under," "upper," "lower" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
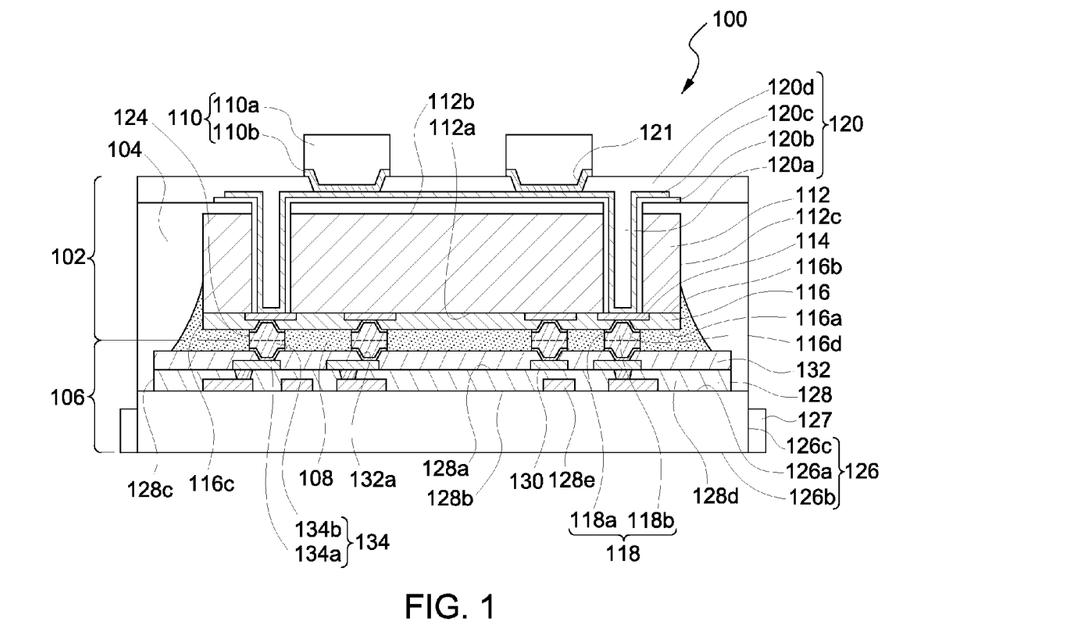
FIG. 1 illustrates a cross-sectional view of a semiconductor package according to an embodiment of the present disclosure.

FIG. 1 illustrates a cross-sectional view of a semiconductor package 100 according to embodiments of the present disclosure. The semiconductor package 100 includes a first semiconductor component 102, a protection layer 104, a second semiconductor component 106, an underfill 108 and external connecting structures 110.

The first semiconductor component 102 may be any semiconductor component including, for example, a chip, a package, an interposer, or a combination thereof. In the embodiment illustrated in FIG. 1, the first semiconductor component 102 includes a first substrate 112, at least one first bonding pad 114, a first insulation layer 116, at least one first conductive connector 118, and at least one conductive via structure 120.

The first substrate 112 has a first surface 112a, a second surface 112b, and a side surface 112c. The first surface 112a is opposite to the second surface 112b. The side surface 112c extends between the first surface 112a and the second surface 112b.

The first bonding pad 114 is disposed adjacent to the first surface 112a of the first substrate 112. The first bonding pad 114 may be, for example, a contact pad of a trace. In the embodiment of FIG. 1, the first surface 112a is an active surface, the first bonding pad 114 is a contact pad, and the first bonding pad 114 is disposed directly (e.g., in physical contact) on the first surface 112a of the first substrate 112. The first bonding pad 112 may include, for example, copper, gold, indium, tin, silver, palladium, osmium, iridium, ruthenium, titanium, magnesium, aluminum, cobalt, nickel, or zinc, other metals, metal alloys, or a combination of two or more thereof.

The first insulation layer 116 covers a portion of each of the first bonding pads 114 and the first surface 112a of the first substrate 112 not covered by the first bonding pads 114. The first insulation layer 116 has a first surface 116a, a second surface 116b, a side surface 116c, and the first insulation layer 116 defines at least one opening 116d. The first surface 116a is opposite to the second surface 116b. The side surface 116c extends between the first surface 116a and the second surface 116b. Each opening 116d exposes at least a portion of a respective first bonding pad 114. The first insulation layer 116 may be, for example, a solder mask (the material of which is, for example, polyimide (PI)) or a passivation layer (the material of which is, for example, a metal oxide).

The first conductive connector 118 is disposed in the opening 116d and contacts the first bonding pad 114. The first conductive connector 118 may be, for example, a pillar structure, which may include an under bump metallization (UBM) layer, a pillar, a barrier layer, a solder layer, or a combination of two or more thereof. As illustrated in FIG. 1, the first conductive connector 118 is a pillar structure which includes a first UBM layer 118a and a first pillar 118b. The first UBM layer 118a is disposed in the opening 116d and contacts the first bonding pad 114. The first pillar 118b is disposed on the first UBM layer 118a and is electrically connected to the first bonding pad 114. In some embodiments, one or both of a barrier layer and a solder layer are included in the first pillar 118b. In an embodiment, the first pillar 118b may include copper, another metal, a metal alloy, or a combination thereof. In an embodiment, the first UBM layer 118a may include a metal, metal alloy, a multi-metal stack, a multi-alloy stack, or a combination thereof. For example, a multi-metal stack can include layers of copper, nickel, vanadium, chromium, and/or gold, and a multi-alloy stack can include layers of alloys of copper, nickel, vanadium, chromium, and/or gold.

The conductive via structure 120 electrically connects the first bonding pad 114 of the first semiconductor component 102 to the external connecting structure 110. The conductive via structure 120 includes a via 120a, a first dielectric layer 120b, a conductive layer 120c, and a second dielectric layer 120d. The via 102a is an opening that extends through the protection layer 104 and the first substrate 112 to the first bonding pad 114. The first dielectric layer 120b covers at least a portion of an inner side wall of the via 120a. In the embodiment of FIG. 1, the first dielectric layer 120b extends from an upper surface of the protection layer 104 to the first bonding pad 114, and further extends along the upper surface of the protection layer 104. The conductive layer 120c is disposed on the first dielectric layer 120b in the via 120a, on the first bonding pad 114, and on a portion of the first dielectric layer 120b extending along the upper surface of the protection layer 104. The conductive layer 120c electrically connects the first bonding pad 114 to the external connecting structure 110.

The second dielectric layer 120d covers exposed portions of the conductive layer 120c and the first dielectric layer 120b, and further covers the second surface 112b of the first substrate 112 not covered by the conductive layer 120c and the first dielectric layer 120b. In the embodiment of FIG. 1, the second dielectric layer 120d further fills a portion of the via 120a not filled by the first dielectric layer 120b and the conductive layer 120c. In other embodiments, the conductive layer 120c, rather than the second dielectric layer 120d, fills the via 120a. The second dielectric layer 120d defines at least one opening 121. Each opening 121 exposes a portion of the conductive layer 120c.

The first dielectric layer 120b may be, for example, formed of a photosensitive material (such as PI). The second dielectric layer 120d may be, for example, formed of a photosensitive material (such as PI) or a passivation layer (the material of which is a metal oxide or a polymer).

The external connecting structure 110 is disposed on the second dielectric layer 120d and in the opening 121 for electrical connection to the conductive layer 120c. The external connecting structure 110 can thus be electrically connected to the first bonding pad 114 by way of the conductive layer 120c through the conductive via structure 120. The external connecting structures 110 may be, for example, copper pillars or solder/stud bumps. In the embodiment illustrated in FIG. 1, the external connecting structure 110 includes a UBM layer 110b and a pillar 110a.

The second semiconductor component 106 may be any semiconductor component including, for example, a chip, a package, an interposer, or a combination thereof. In the embodiment illustrated in FIG. 1, the second semiconductor component 106 includes a second substrate 126, at least one redistribution layer (RDL) 128, at least one second bonding pad 130, a second insulation layer 132, and at least one second conductive connector 134.

The second substrate 126 has a first surface 126a, a second surface 126b, and a side surface 126c. The first surface 126a is opposite to the second surface 126b. The side surface 126c extends between the first surface 126a and the second surface 126b. The second substrate 126 includes a protrusion portion 127 extending from the side surface 126c. The protrusion portion 127 may extend from the side surface 126c around a periphery of the semiconductor package 100, or the protrusion portion 127 may be omitted.

The RDL 128 is disposed adjacent to the first surface 126a of the second substrate 126. The RDL 128 has a first surface 128a, a second surface 128b, and a side surface 128c. The first surface 128a is opposite to the second surface 128b. The side surface 128c extends between the first surface 128a and the second surface 128b. The second surface 128b of the RDL 128 faces the first surface 126a of the second substrate 126. The RDL 128 includes a dielectric layer 128d and a patterned conductive layer 128e.

The second bonding pad 130 is disposed adjacent to the first surface 128a of the RDL 128. The second bonding pad 130 may be, for example, a contact pad of a trace. In the embodiment of FIG. 1, the second semiconductor component 106 is a chip, the first surface 126a is an active surface, the second bonding pad 130 is a contact pad, and the second bonding pad 130 is disposed directly (e.g., in physical contact) on the first surface 128a of the RDL 128. The second bonding pad 130 may include, for example, copper, gold, indium, tin, silver, palladium, osmium, iridium, ruthenium, titanium, magnesium, aluminum, cobalt, nickel, or zinc, other metals, metal alloys, or a combination of two or more thereof.

The second insulation layer 132 covers a portion of each of the second bonding pads 130 and further covers the first surface 128a of the RDL 128. The second insulation layer 132 defines at least one opening 132a. The opening 132a exposes at least a portion of the second bonding pad 130. The second insulation layer 132 may be, for example, a solder mask (the material of which is, for example, PI) or a passivation layer (the material of which is, for example, a metal oxide).

The second conductive connector 134 is disposed in the opening 132a and contacts the second bonding pad 130. The structures and components of the second conductive connector 134 may be similar to those described above with respect to the first conductive connector 118. In the embodiment of FIG. 1, the second conductive connector 134 is a pillar structure including a second UBM layer 134a and a second pillar 134b.

The second semiconductor component 106 may be electrically connected to the first semiconductor component 102, such as through wire bonds, pillars, solder bumps, solder pillars, or other connections. The second semiconductor component 106 may be electrically connected to the first semiconductor component 102 through the first conductive connector 118 and the second conductive connector 134. In the embodiment of FIG. 1, each first conductive connector 118 is electrically connected to and aligned with a respective second conductive connector 134. In this embodiment, the first conductive connector 118 is bonded to the second conductive connector 134 directly and together they form a connection element 124. The first conductive connector 118 may be bonded to the second conductive connector 134 by a metal fusion bonding technique or a metal eutectic bonding technique so there may not be a discernable interface between the first conductive connector 118 and the second conductive connector 134 after bonding. Accordingly, the dotted line between the first conductive connector 118 and the second conductive connector 134 in FIG. 1 is provided by way of illustration, and does not necessarily represent an actual interface. The bonding technique of the first conductive connector 118 and the second conductive connector 134 may reduce or eliminate use of a solder.

The underfill 108 is disposed between the first semiconductor component 102 and the second semiconductor component 106 to protect the connection elements 124 from oxidation, moisture, and other environmental conditions. In some embodiments, the underfill 108 is omitted.

The protection layer 104 encapsulates portions of the first semiconductor component 102 and the second semiconductor component 106. The protection layer 104 covers at least a portion of the second surface 112b of the first substrate 112. The protection layer 104 above the second surface 112b of the first substrate 112 is substantially flat so that drilling or etching for forming the via 120a of the conductive via structure 120 can be facilitated. The protection layer 104 further covers a portion of the side surface 112c of the first substrate 112 and at least a portion of the underfill 108, and may extend to cover portions of the second semiconductor component 106, including covering portions of the second surface 126b of the second substrate 126. In this manner, the first semiconductor component 102, and the electrical connection between the first semiconductor component 102 and the second semiconductor component 106, may be protected from oxidation, moisture, and other environmental conditions. In addition, the extension of the protection layer 104 from the second surface 112b of the first substrate 112 to the second semiconductor component 106 can assist in compensating for differences in CTE between the first semiconductor component 102 and the second semiconductor component 106, thus reducing warpage and cracking.

In the embodiment of FIG. 1, the protection layer 104 covers portions of the second surface 112b of the first substrate 112, portions of the side surface 112c of the first substrate 112, portions of the underfill 108, portions of the second insulation layer 132 (e.g., a side surface and a portion of a top surface), and the side surface 128c of the RDL 128. The protection layer 104 may surround the first semiconductor component 102 and the underfill 108, and may further surround the second semiconductor component 106 (not shown) or portions thereof. In the embodiment of FIG. 1, the protection layer 104 extends from the second surface 112b of the first substrate 112 to the first surface 126a of the second substrate 126.

Figure 2:
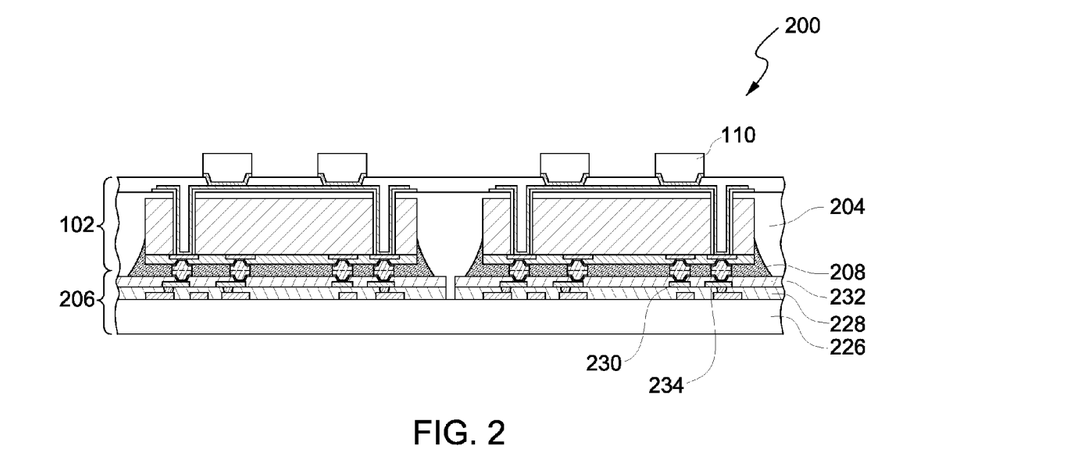
FIG. 2 illustrates a cross-sectional view of a semiconductor package according to an embodiment of the present disclosure.

FIG. 2 illustrates a cross-sectional view of a semiconductor package 200 according to an embodiment of the present disclosure. The semiconductor package 200 of FIG. 2 includes first semiconductor components 102, a protection layer 204, a semiconductor component 206, an underfill 208, and external connecting structures 110.

The first semiconductor component 102 illustrated in FIG. 2 is similar to the first semiconductor component 102 illustrated in FIG. 1 and described above. Therefore, for the sake of conciseness, the first semiconductor component 102 illustrated in FIG. 2 is not described again with respect to FIG. 2.

The protection layer 204 illustrated in FIG. 2 is similar to the protection layer 104 illustrated in FIG. 1 and described above except that the protection layer 204 covers at least a portion of more than one first semiconductor component 102. As described above with respect to the protection layer 104, the protection layer 204 protects against oxidation, moisture, and other environmental conditions, and further assists in compensating for CTE differences between the first semiconductor components 102 and between the first semiconductor components 102 and the semiconductor component 206.

The protection layer 204 above the second surfaces 112b of the first substrates 112 is substantially flat so that drilling or etching for forming the vias 120a of the conductive via structures 120 will not be affected by differences in dimensions of the first semiconductor components 102 (e.g., differences in height or thickness of the first semiconductor components 102 or the first substrates 112 of the first semiconductor components 102).

The semiconductor component 206 may be, for example, a wafer. In the embodiment of FIG. 2, the semiconductor component 206 is a wafer including multiple dies. Each die may be similar to the second semiconductor component 106 illustrated in FIG. 1. The semiconductor component 206 includes a second substrate 226, at least one RDL 228, at least one bonding pad 230, an insulation layer 232, and at least one second conductive connector 234.

The RDL 228 is disposed adjacent to an upper surface (in the orientation shown) of the second substrate 226.

The bonding pad 230 is disposed adjacent to an upper surface (in the orientation shown) of the RDL 228 and is electrically connected to the RDL 228.

The insulation layer 232 covers a portion of each of the bonding pads 230 and further covers the upper surface of the RDL 228. The insulation layer 232 defines at least one opening exposing at least a portion of a bonding pad 230.

The second conductive connector 234 is disposed in the opening defined by the insulation layer 232 and contacts the bonding pad 230.

The underfill 208 may optionally be disposed between the first semiconductor components 102 and the semiconductor component 206. External connecting structures 110 may be disposed on the first semiconductor components 102 as described with respect to FIG. 1.

Figure 3:
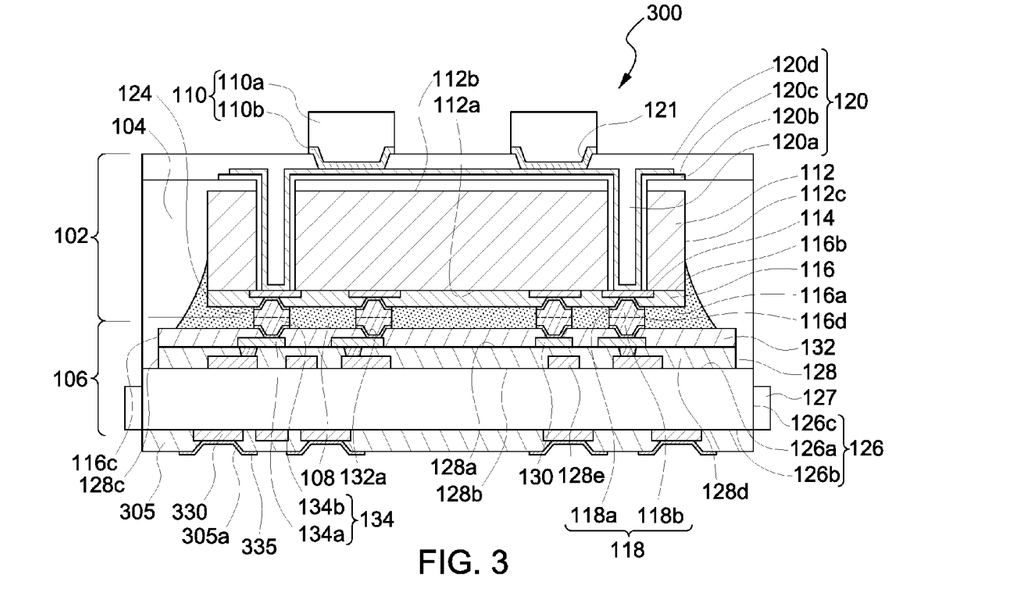
FIG. 3 illustrates a cross-sectional view of a semiconductor package according to an embodiment of the present disclosure.

FIG. 3 illustrates a cross-sectional view of a semiconductor package 300 according to an embodiment of the present disclosure. The semiconductor package 300 in FIG. 3 is similar to the semiconductor package 100 in FIG. 1, with differences including that the second semiconductor component 106 further includes a protection layer 305 disposed adjacent to the second surface 126b of the second substrate 126 and at least one external bonding pad 330, and may include a UBM layer 335.

The external bonding pad 330 is disposed adjacent to the second surface 126b of the second substrate 126.

The protection layer 305 covers a portion of the external bonding pad 330 and further covers the second surface 126b of the second substrate 126. The protection layer 305 defines at least one opening 305a exposing at least a portion of the external bonding pad 330 for external electrical connection, such as connection to a copper pillar, solder or stud bump. The UBM layer 335 is optionally disposed in the opening 305a, and optionally extends onto a lower surface of the protection layer 305. The protection layer 305 may be, for example, a solder mask (the material of which is, for example, PI) or a passivation layer (the material of which, for example, is a metal oxide). By providing both the external connecting structures 110 and the external bonding pads 330, the semiconductor package 300 may have enhanced design flexibility due to the possibility for providing external electrical connection from both a top side and a bottom side of the semiconductor package 300.

FIGS. 4A-4D illustrate a method for partially manufacturing the first semiconductor component 102 according to an embodiment of the present disclosure.

Figure 4A:
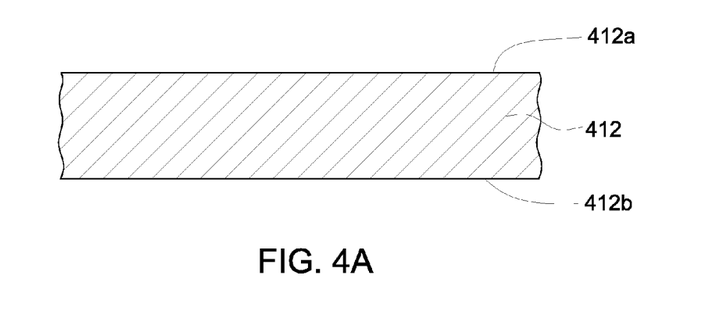
FIG. 4A, FIG. 4B, FIG. 4C, and FIG. 4D illustrate a manufacturing method in accordance with an embodiment of the present disclosure.

Referring to FIG. 4A, a substrate 412 is provided. In one or more embodiments, the substrate is a wafer. The substrate 412 has a first surface 412a and a second surface 412b. The first surface 412a is opposite to the second surface 412b. In the embodiment of FIG. 4A, the first surface 412a is an active surface.

Figure 4B:
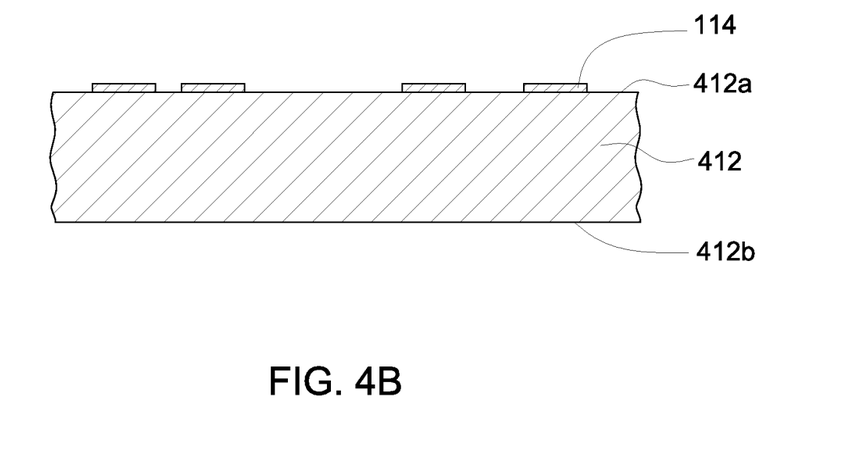

Referring to FIG. 4B, at least one first bonding pad 114 is disposed on the first surface 412a of the substrate 412. The first bonding pad 114 may be formed, for example, by photolithography in combination with etching and electroplating or physical vapor deposition.

Figure 4C:
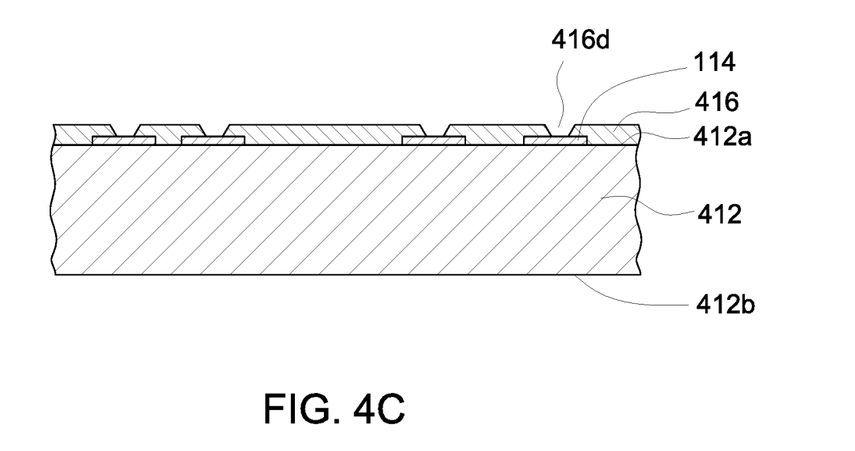

Referring to FIG. 4C, a first insulation layer 416 is disposed on the first surface 412a of the substrate 412, such as by lamination or adhesion. The first insulation layer 416 covers a portion of the first bonding pad 114 and further covers the first surface 412a of the substrate 412. The first insulation layer 416 defines at least one opening 416d exposing at least a portion of the first bonding pad 114. The first insulation layer 416 may include a photosensitive material, such as a PI, so that the opening 416d can be formed by a photolithography and etching processes.

Figure 4D:
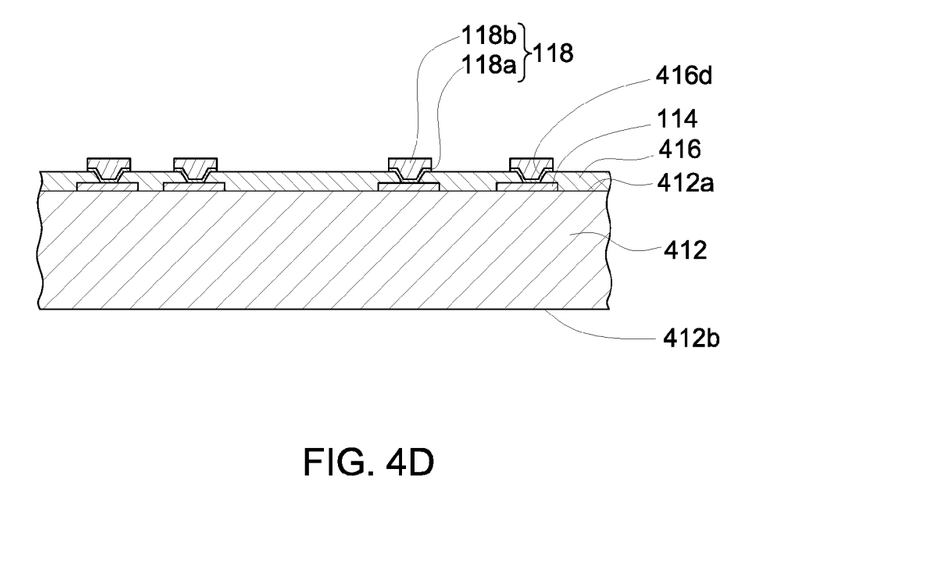

Referring to FIG. 4D, a first conductive connector 118 is disposed in the opening 416d and contacts the first bonding pad 114. In the embodiment of FIG. 4D, the first conductive connector 118 is a pillar structure including a UBM layer 118a and a pillar 118b. The first conductive connector 118 may be formed, for example, by photolithography in combination with etching and electroplating or physical vapor deposition.

Figure 6A:
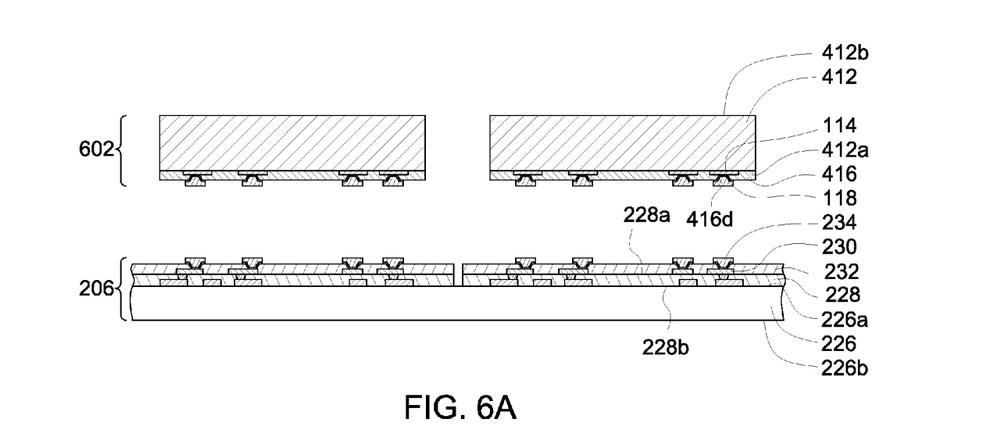
FIG. 6A, FIG. 6B, FIG. 6C, FIG. 6D, FIG. 6E, FIG. 6F, FIG. 6G, and FIG. 6H illustrate a manufacturing method in accordance with an embodiment of the present disclosure.

Subsequently, the substrate 412 may be thinned from the second surface 412b to obtain a desired thickness, and a singulation process (e.g., sawing) is performed to obtain individual semiconductor component units (e.g., a semiconductor device 602 as is illustrated in FIG. 6A).

FIGS. 5A-5D illustrate a method for manufacturing the semiconductor component 206 of FIG. 2 according to an embodiment of the present disclosure.

Figure 5A:
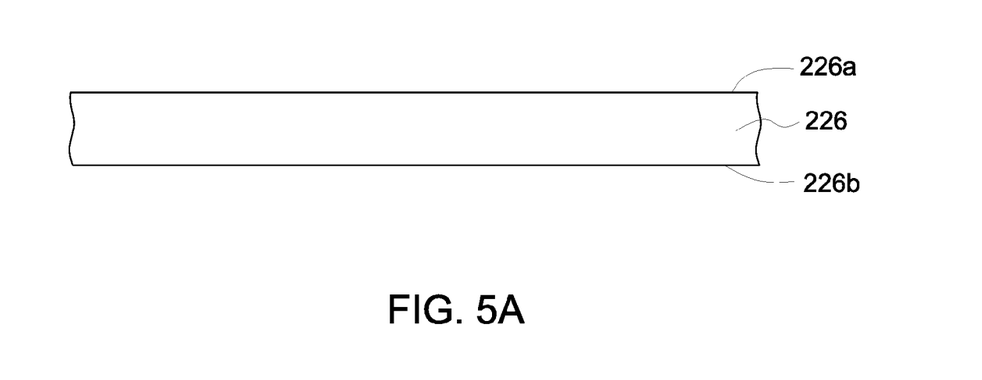
FIG. 5A, FIG. 5B, FIG. 5C, and FIG. 5D illustrate a manufacturing method in accordance with an embodiment of the present disclosure.

Referring to FIG. 5A, a second substrate 226 is provided. In one or more embodiments, the second substrate 226 is a wafer. The second substrate 226 has a first surface 226a and a second surface 226b. The first surface 226a is opposite to the second surface 226b. In the embodiment of FIG. 5A, the first surface 226a is an active surface.

Figure 5B:
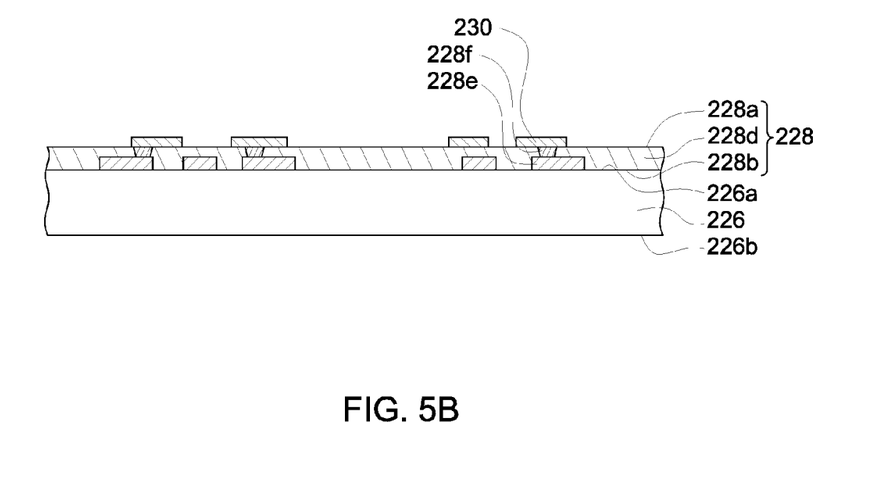

Referring to FIG. 5B, an RDL 228 is disposed adjacent to the first surface 226a of the second substrate 226. The RDL 228 has a first surface 228a and a second surface 228b opposite to the first surface 228a. The second surface 228b faces the first surface 226a of the second substrate 226. The RDL 228 includes a dielectric layer 228d and a patterned conductive layer 228e. At least one bonding pad 230 is disposed adjacent to the first surface 228a of the RDL 228 and is electrically connected to the patterned conductive layer 228e of the RDL 228 through a conductive via 228f. The bonding pad 230 may be, for example, a contact pad of a trace. In the embodiment of FIG. 5B, the bonding pad 230 is a contact pad, and the bonding pad 230 is disposed directly on (e.g., physically contacting) the first surface 228a of the RDL 228.

Figure 5C:
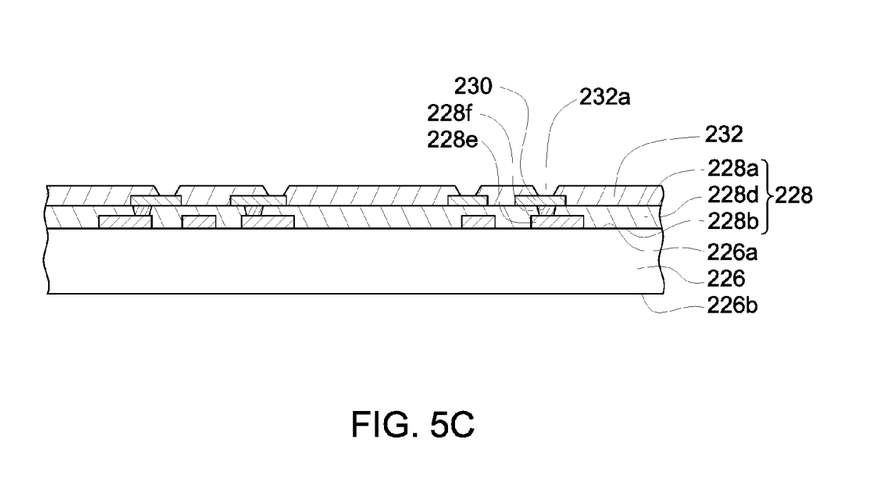

Referring to FIG. 5C, an insulation layer 232 is disposed on the first surface 228a of the RDL 228, such as by lamination or adhesion. The insulation layer 232 covers a portion of the bonding pad 230 and further covers the first surface 228a of the RDL 228. The insulation layer 232 defines at least one opening 232a exposing at least a portion of the bonding pad 230. The insulation layer 232 may be formed of a photosensitive material, such as a PI, so that the opening 232a can be formed by photolithography and etching, for example.

Figure 5D:
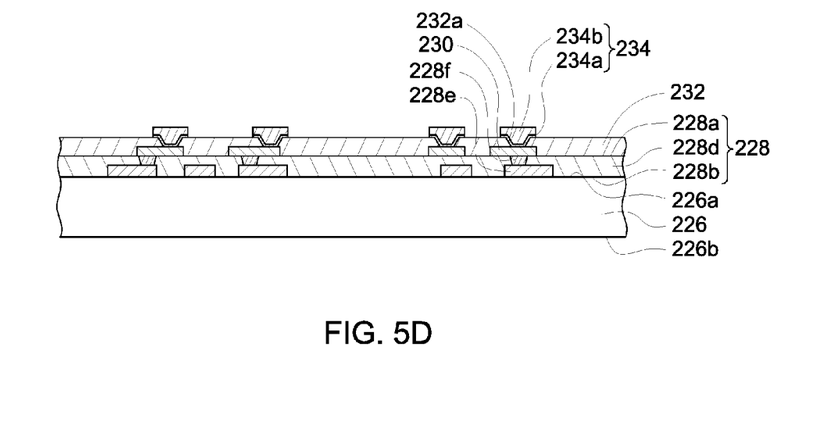

Referring to FIG. 5D, a second conductive connector 234 is disposed in the opening 232a and contacts the bonding pad 230. In the embodiment of FIG. 5D, the second conductive connector 234 is a pillar structure including a UBM layer 234a and a pillar 234b. The second conductive connector 234 may be formed by photolithography in combination with etching process and electroplating or physical vapor deposition. By the method of FIGS. 5A-5D, the semiconductor component 206 in FIG. 2 can be obtained.

The second substrate 226 may be thinned from the second surface 226b to obtain a desired thickness. After that, a singulation process, such as sawing, may be performed to obtain individual semiconductor component units.

FIGS. 6A-6H illustrate a method for manufacturing a semiconductor package such as the semiconductor package 100 of FIG. 1 according to an embodiment of the present disclosure.

Referring to FIG. 6A, at least one semiconductor device 602 (e.g., obtained in accordance with the embodiment illustrated in FIGS. 4A-4D) and a semiconductor component 206 (e.g., obtained in accordance with the embodiment illustrated in FIGS. 5A-5D) are provided. A first conductive connector 118 of the semiconductor device 602 is aligned with and bonded to a second conductive connector 234 of the semiconductor component 206.

The semiconductor devices 602 of FIG. 6A are each substantially similar to the individual semiconductor component unit illustrated in FIG. 4D. The semiconductor device 602 includes a substrate 412 (including a first surface 412a and a second surface 412b), at least one first bonding pad 114, a first insulation layer 416, and a first conductive connector 118. The first bonding pad 114 is disposed on the first surface 412a of the substrate 412. The first insulation layer 416 is disposed on the first surface 412a of the substrate 412 and covers a portion of the first bonding pad 114 and further covers a portion of the first surface 412a. The first insulation layer 416 defines at least one opening 416d exposing at least a portion of the first bonding pad 114. The first conductive connector 118 is disposed in the opening 416d and contacts the first bonding pad 114.

The semiconductor component 206 of FIG. 6A is substantially similar to the semiconductor component 206 of FIG. 5D. The semiconductor component 206 of FIG. 6A includes a second substrate 226 (including a first surface 226a and a second surface 226b), at least one RDL 228, at least one bonding pad 230, an insulation layer 232, and a second conductive connector 234. The RDL 228 is disposed adjacent to the first surface 226a of the second substrate 226. The second bonding pad 230 is disposed adjacent to the first surface 228a of the RDL 228. The insulation layer 232 is disposed on the first surface 228a of the RDL 228. The second conductive connector 234 is disposed in an opening defined by the second insulation layer 232 and contacts the bonding pad 230.

A bond between the first conductive connector 118 and the second conductive connector 234 may be formed by thermo-compression bonding to form connection elements 124 as illustrated in FIG. 1. During thermo-compression bonding, an operation pressure may be from about 2 Newtons (Nt) to about 70 Nt, such as from about 3 Nt to about 60 Nt, or from about 5 Nt to about 50 Nt; an operation temperature may be from about 180° C. to about 280° C., such as from about 190° C. to about 270° C., or from about 200° C. to about 260° C.; and an operation period can be from about 2 seconds to about 40 seconds, such as from about 3 seconds to about 35 seconds, or from about 4 seconds to about 30 seconds.

Figure 6B:
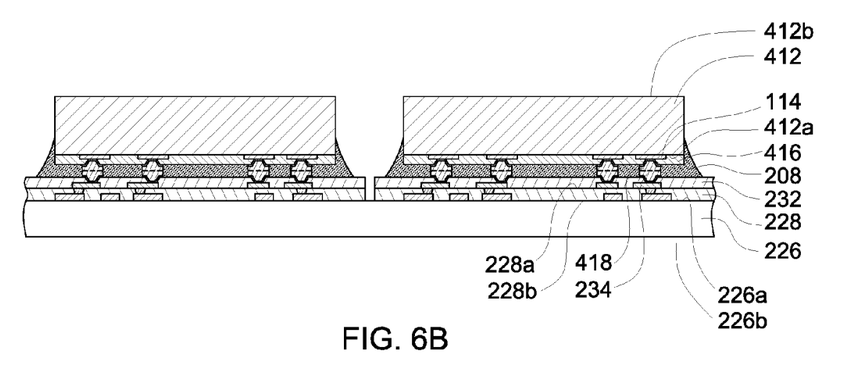

Referring to FIG. 6B, an underfill 208 is applied so as to be disposed between the semiconductor device 602 and the semiconductor component 206 to protect the connection elements 124 from oxidation, moisture, and other environmental conditions. The underfill 208 is the same as the underfill 208 illustrated in FIG. 2, and may cover at least a portion of a side surface of the semiconductor device 602 and the surface of the insulation layer 232 of the semiconductor component 206.

Figure 6C:
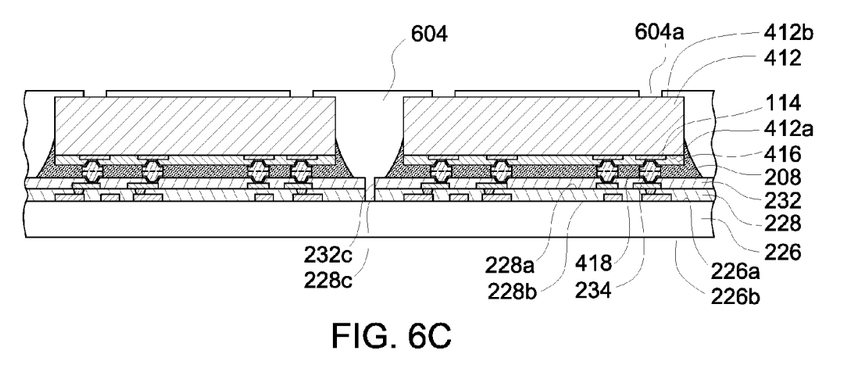

Referring to FIG. 6C, a protection material (e.g., a photosensitive material, such as a PI) is disposed over the semiconductor device 602 to form a protection layer 604. The protection layer 604 covers at least a portion of the second surface 412b of the substrate 412 of the semiconductor device 602 and may further cover at least a portion of a side surface 412c of the semiconductor device 602, at least a portion of the underfill 208, and at least a portion of the semiconductor component 206. In the embodiment of FIG. 6C, the protection layer 604 covers at least a portion of the second surface 412b of the substrate 412, at least a portion of the side surface 412c of the substrate 412, at least a portion of the underfill 208, at least a portion of a side surface 232c of the insulation layer 232, and at least a portion of a side surface 228c of the RDL 228 of the semiconductor component 206. In the embodiment of FIG. 6C, the protection layer 604 extends from the second surface 412b of the substrate 412 of the semiconductor device 602 to the side surface 228c of the RDL 228.

The protection layer 604 defines at least one opening 604a exposing a portion of the second surface 412b of the substrate 412 of the semiconductor device 602. The opening 604a defines a location for drilling or etching for forming a via.

Figure 6D:
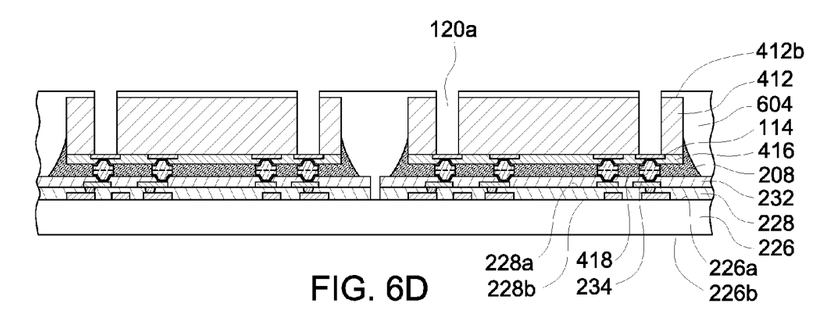

Referring to FIG. 6D, a via 120a extending from the second surface 412b of the substrate 412 of the semiconductor device 602 to the first bonding pad 114 is formed, such as by drilling or etching.

Figure 6E:
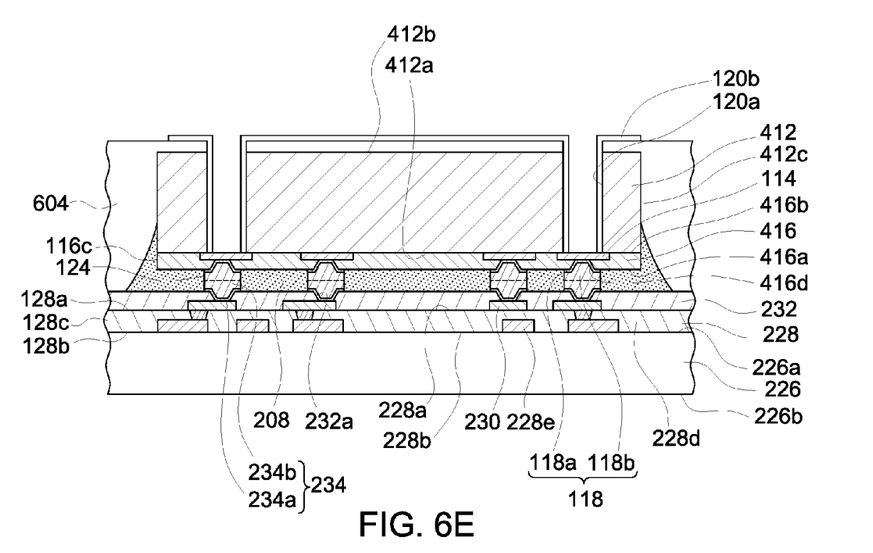

Referring to FIG. 6E, a first dielectric layer 120b is disposed in the via 120a. The first dielectric layer 120b covers an inner side wall of the via 120a. In the embodiment of FIG. 6E, the first dielectric layer 120b contacts the first bonding pad 114 and extends from the bottom of the via 120a to an upper surface of the protection layer 604 and onto the upper surface of the protection layer 604. The first dielectric layer 120b may be formed, for example, by photolithography in combination with etching.

Figure 6F:
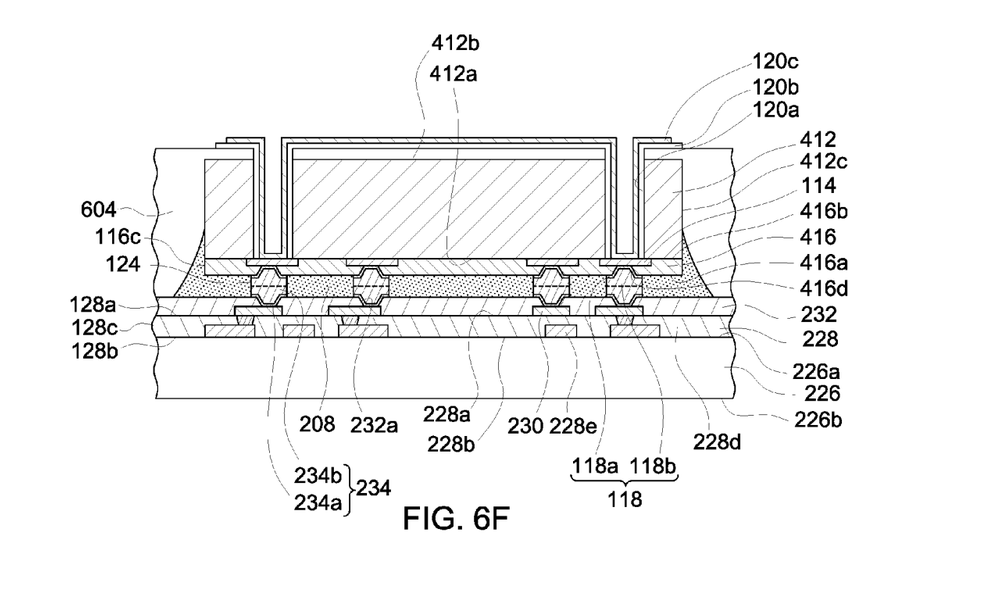

Referring to FIG. 6F, a conductive layer 120c is disposed on the first dielectric layer 120b where it extends over the upper surface of the protection layer 604 and is disposed on the first dielectric layer 120b within the via 120a. The conductive layer 120c is further disposed on the first bonding pad 114. The conductive layer 120c may include a contact pad (e.g., a bonding pad for a solder ball or a pillar) for electrical connection, such as to an external connection (e.g., the external connecting structure 110 in FIG. 1).

Figure 6G:
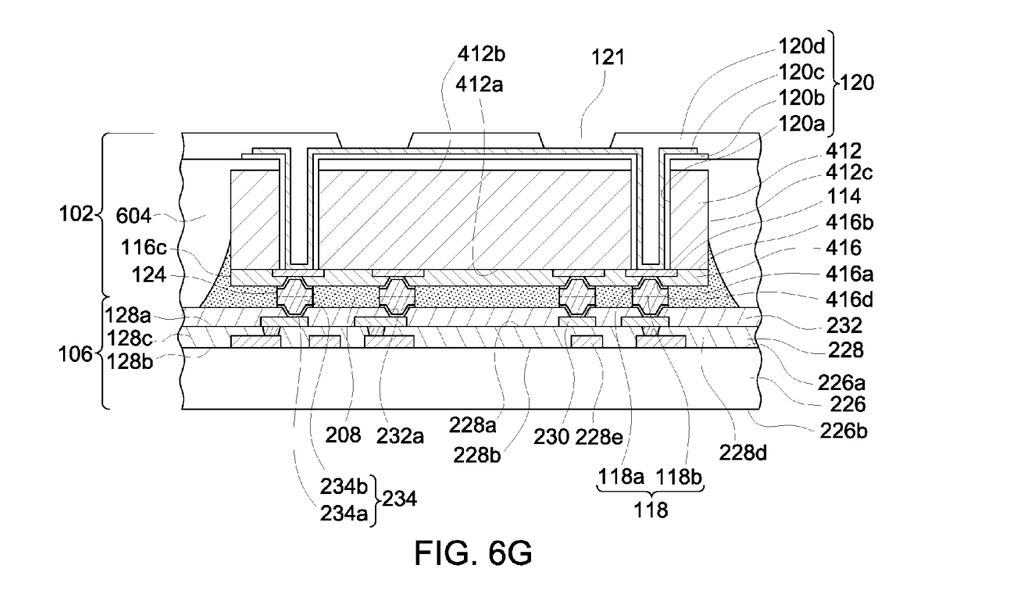

Referring to FIG. 6G, a second dielectric layer 120d is disposed on the conductive layer 120c. The second dielectric layer 120d covers a portion of the conductive layer 120c and may further cover a portion of the first dielectric layer 120b. The second dielectric layer 120d defines at least one opening 121 exposing a portion of the conductive layer 120c. In the embodiment of FIG. 6G, the second dielectric layer 120d fills the via 120a. As seen in FIG. 6G, the second dielectric layer 120d extends over a portion of the surface of the conductive layer 120c. The second dielectric layer 120d may be formed, for example, by photolithography in combination with etching.

Figure 6H:
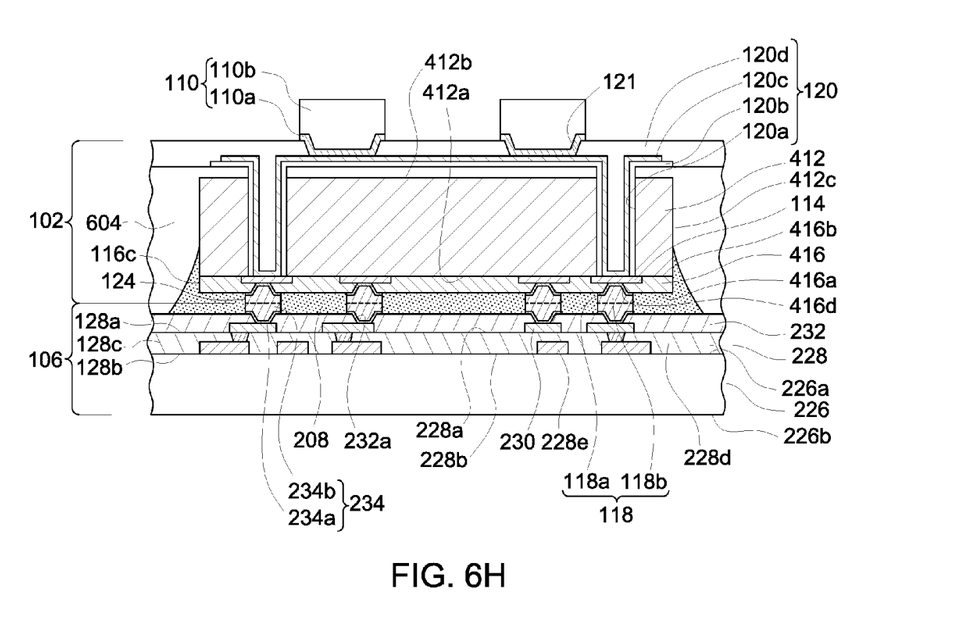

Referring to FIG. 6H, an external connecting structure 110 is disposed in the opening 121 and contacts the conductive layer 120c (e.g., through a bonding pad). The external connecting structure 110 may be formed, for example, by photolithography in combination with etching. In the embodiment of FIG. 6H, the external connecting structure 110 is a pillar structure including a UBM layer 110a and a pillar 110b. By the technique of FIGS. 6A-6H, the semiconductor package 200 illustrated in FIG. 2 can be obtained.

Subsequently, a separation technique (e.g., sawing) is performed to obtain individual semiconductor packages such as the semiconductor package 100 of FIG. 1. The separation technique may include two cutting passes, where a cutting tool for the first pass should have a lesser degree of hardness than the cutting tool for the second pass, and the cutting tool for the first pass should have a wider blade than the cutting tool for the second pass, so that a crack may be avoided during separation (singulation). In embodiments where such a two-pass separation technique is used, a protrusion portion (e.g., the protrusion portion 127 of FIG. 1) may be produced by the technique.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm, or no greater than 0.5 µm.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
   a first semiconductor component comprising a first substrate having a first surface and a second surface opposite to the first surface, the first semiconductor component further comprising at least one first bonding pad disposed adjacent to the first surface of the first substrate and at least one conductive via structure extending from the second surface of the first substrate to the first bonding pad, wherein the first surface of the first substrate is an active surface of the first substrate;
   a second semiconductor component comprising a second substrate having a first surface and a second surface opposite to the first surface, the second semiconductor component further comprising a redistribution layer disposed on the first surface of the second substrate, and at least one second bonding pad disposed on the redistribution layer, wherein the first surface of the second substrate is an active surface of the second substrate, and the first surface of the first substrate faces the first surface of the second substrate; and
   at least one connecting element disposed between the first bonding pad and the second bonding pad.

2. The semiconductor package of claim 1, further comprising a protection layer disposed on at least a portion of the second surface of the first substrate.

3. The semiconductor package of claim 2, wherein the protection layer extends from the second surface of the first substrate to the first surface of the second substrate.

4. The semiconductor package of claim 2, wherein the protection layer comprises a polymer.

5. The semiconductor package of claim 1, further comprising a protrusion portion extending from a side surface of the second substrate.

6. The semiconductor package of claim 1, wherein the first substrate defines a via, and the conductive via structure comprises a first dielectric layer, a conductive layer, and a second dielectric layer, wherein the first dielectric layer covers an inner wall of the via, the conductive layer is disposed on the first dielectric layer and the first bonding pad, and the second dielectric layer is disposed on the conductive layer.

7. The semiconductor package of claim 6, wherein the second dielectric layer fills the via.

8. The semiconductor package of claim 1, further comprising at least one external connecting structure disposed adjacent to the second surface of the first substrate.

9. The semiconductor package of claim 8, further comprising at least one external bonding pad disposed adjacent to the second surface of the second substrate.

10. A semiconductor package, comprising:
    a wafer having a first surface and a second surface opposite to the first surface, the first surface of the wafer is an active surface of the wafer; and
    a plurality of semiconductor components disposed adjacent to the first surface of the wafer, each semiconductor component comprising a substrate having a first surface and a second surface opposite to the first surface, and each semiconductor component further comprising at least one bonding pad disposed adjacent to the first surface of the substrate and at least one conductive via structure extending from the second surface of the substrate to the bonding pad, wherein each semiconductor component is electrically connected to the first surface of the wafer through the bonding pad, the first surface of the substrate is an active surface of the substrate, and the first surface of the substrate faces the first surface of the wafer.

11. The semiconductor package of claim 10, further comprising a protection layer disposed on at least a portion of the second surface of the substrate of at least one of the semiconductor components.

12. The semiconductor package of claim 11, wherein the protection layer extends from the second surface of the substrate to the first surface of the wafer.

13. The semiconductor package of claim 11, wherein the protection layer comprises a polymer.

14. The semiconductor package of claim 10, wherein the conductive via structure of at least one of the semiconductor components comprises a first dielectric layer, a conductive layer, and a second dielectric layer, wherein the first dielectric layer covers an inner wall of a via defined by the substrate, the conductive layer is disposed on the first dielectric layer and the bonding pad, and the second dielectric layer is disposed on the conductive layer.

15. The semiconductor package of claim 14, wherein the second dielectric layer fills the via.

16. The semiconductor package of claim 2, wherein the protection layer encapsulates at least a portion of the first semiconductor component and at least a portion of the second semiconductor component.

17. The semiconductor package of claim 1, further comprising an underfill disposed between the first semiconductor component and the second semiconductor component.

18. The semiconductor package of claim 17, wherein the underfill encapsulates the at least one connecting element.

19. The semiconductor package of claim 11, wherein the protection layer encapsulates at least a portion of the wafer and at least a portion of at least one semiconductor component of the plurality of semiconductor components.

20. The semiconductor package of claim 10, further comprising an underfill disposed between the wafer and the plurality of semiconductor components.

* * * * *